United States Patent
Kim et al.

(10) Patent No.: US 9,337,211 B2
(45) Date of Patent: May 10, 2016

(54) BACKPLANE OF FLAT PANEL DISPLAY AND METHOD OF MANUFACTURING THE SAME

(71) Applicant: SAMSUNG DISPLAY CO., LTD., Yongin, Gyeonggi-Do (KR)

(72) Inventors: Jong-Yun Kim, Yongin (KR); Cheol-Ho Yu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 14/092,477

(22) Filed: Nov. 27, 2013

(65) Prior Publication Data

US 2014/0374759 A1     Dec. 25, 2014

(30) Foreign Application Priority Data

Jun. 20, 2013    (KR) .................. 10-2013-0071159

(51) Int. Cl.
  *H01L 27/32*    (2006.01)
  *H01L 27/12*    (2006.01)
(52) U.S. Cl.
  CPC ........ *H01L 27/1218* (2013.01); *H01L 27/1259* (2013.01); *H01L 27/1262* (2013.01); *H01L 27/32* (2013.01); *H01L 27/3223* (2013.01); *H01L 27/3244* (2013.01); *H01L 2227/323* (2013.01)
(58) Field of Classification Search
  CPC . H01L 27/1214; H01L 27/1218; H01L 27/32; H01L 27/3223; H01L 27/3244; H01L 27/1259; H01L 27/1262; H01L 2227/32; H01L 2227/323; H01L 27/3237; H01L 27/3241; H01L 27/3246

USPC ............... 257/40, 59, 72, E51.022, E51.001, 257/E51.026, E33.001
See application file for complete search history.

(56) References Cited

U.S. PATENT DOCUMENTS

| 6,327,011 | B2 * | 12/2001 | Kim | 349/122 |
| 2005/0206304 | A1 * | 9/2005 | Kim | 313/504 |
| 2012/0132917 | A1 * | 5/2012 | Lee et al. | 257/59 |

FOREIGN PATENT DOCUMENTS

| JP | 2008-191601 | 8/2008 |
| KR | 10-2006-0078382 | 7/2006 |
| KR | 10-2007-0018674 | 2/2007 |
| KR | 10-1222963 | 1/2013 |

\* cited by examiner

*Primary Examiner* — Galina Yushina
(74) *Attorney, Agent, or Firm* — Lewis Roca Rothgerber Christie LLP

(57) ABSTRACT

Provided are a backplane for a flat panel display device and a method of manufacturing the backplane. The method of manufacturing the backplane for a flat panel display device includes forming an insulation substrate on a glass substrate, forming a protection layer on the insulation substrate, the protection layer including a first opening exposing a portion of the insulation substrate, forming a first hole in the insulation substrate by removing the portion of the insulation substrate exposed by the first opening, and forming a transistor on the protection layer, the transistor including an active layer, a gate electrode, a source electrode, and a drain electrode. The insulation substrate may include a transistor area including the transistor, and a non-transistor area excluding the transistor and including the first hole.

18 Claims, 6 Drawing Sheets

BACKPLANE OF FLAT PANEL DISPLAY AND METHOD OF MANUFACTURING THE SAME

CROSS-REFERENCE TO RELATED APPLICATION

This application claims priority to and the benefit of Korean Patent Application No. 10-2013-0071159, filed on Jun. 20, 2013, in the Korean Intellectual Property Office, the disclosure of which is incorporated herein in its entirety by reference.

BACKGROUND

1. Field

The present invention relates to a backplane for a flat panel display and a method of manufacturing the same.

2. Description of the Related Art

A flat panel display device, such as an organic light-emitting display (OLED) device or a liquid crystal display (LCD) device, includes a backplane having at least one thin-film transistor (TFT). The TFT includes an active layer, which provides a channel area, a source area, and a drain area, and a gate electrode that is formed on the channel area and is electrically insulated from the active layer by a gate insulating layer.

The active layer of such a TFT may be formed of a semiconductor material, such as amorphous silicon and polysilicon, requiring high temperature for heat treatment of the semiconductor material. For example, a method of manufacturing a TFT by using low temperature polysilicon (LTPS) requires a temperature above about 450° C. to perform a dehydrogenation process or an activation process.

OLED devices have excellent characteristics in terms of viewing angle, response speed, power consumption, etc., and thus, the application and use of OLED devices has expanded from personal mobile apparatuses, such as MP3 players or mobile phones, to devices such as televisions. There have been attempts at forming an OLED device with a transparent display by making the thin-film transistor TFT of the OLED device of a transparent type or material. However, some of the transparent materials for forming the transparent display device are often damaged at higher temperatures. For example, damage such as a surface film rupture at the backplane of the display device may occur due to an outgassing phenomenon at a high temperature.

SUMMARY

One or more embodiments of the present invention relate to a backplane for a flat panel display, which is resistant to high temperature processes, and a method of manufacturing the backplane.

Additional aspects will be set forth in part in the description which follows and, in part, will be apparent from the description, or may be learned by practice of the presented embodiments.

According to an aspect of the present invention, there is provided a method of manufacturing a backplane for a flat panel display device, the method including forming an insulation substrate on a glass substrate, forming a protection layer on the insulation substrate, the protection layer including a first opening exposing a portion of the insulation substrate, forming a first hole in the insulation substrate by removing the portion of the insulation substrate exposed by the first opening, and forming a transistor on the protection layer, the transistor including an active layer, a gate electrode, a source electrode, and a drain electrode, wherein the insulation substrate includes a transistor area including the transistor, and a non-transistor area in which the first hole is formed, and in which the transistor is omitted.

In an embodiment, a width of the first hole may be wider than a width of the first opening.

In an embodiment, forming the first hole may include removing the portion of the insulation substrate exposed by the first opening such that a distance from a center of the first opening to a sidewall of the first hole is greater than a distance from the center of the first opening to a side end of the first opening.

In an embodiment, the protection layer may protrude in an overhang structure with respect to the first hole at the first opening.

In one embodiment, forming the transistor further includes filling the first hole by depositing at least some materials constituting the transistor into the first hole, forming a dummy pattern.

In some embodiments, a height of the dummy pattern may be shorter than a height of the insulation substrate.

The method may further include forming a first insulating layer covering the transistor, the first insulating layer including a second hole exposing a portion of the source electrode or drain electrode, wherein the first insulating layer is formed while filling the first hole.

The method may further include forming a pixel electrode on the first insulating layer, the pixel electrode being electrically connected to either one of the source electrode or the drain electrode via the second hole.

The method may further include forming a second insulating layer on the first insulating layer covering an edge of the pixel electrode, the second insulating layer including a second opening exposing at least a portion of the pixel electrode.

The method may further include forming an intermediate layer including an organic emissive layer on the at least a portion of the pixel electrode exposed by the second opening, and forming an opposite electrode on the pixel electrode with the intermediate layer therebetween.

In one embodiment, forming the first hole may include removing the portion of the insulation substrate exposed by the first opening using an ashing process.

In one embodiment, the active layer may include amorphous silicon or polysilicon, and forming the transistor may include using a low-temperature polycrystalline silicon (LTPS) process.

The method may further include forming a stopper filling the first hole; and forming a passivation layer covering the transistor and the stopper, the passivation layer including a passivation hole for exposing a portion of the source electrode or the drain electrode.

In one embodiment, the stopper may include an inorganic material capable of coating a surface of the first hole.

In one embodiment, the passivation layer may include silicon nitride ($Si_3N_4$).

The method may further include separating the insulation substrate from the glass substrate; and attaching a protection film to a lower surface of the separated insulation substrate.

According to another aspect of the present invention, there is provided a backplane for a flat panel display device, the backplane including an insulation substrate including a transistor area including a transistor, and a non-transistor area including a first hole, a protection layer positioned on the insulation substrate, the protection layer including a first opening corresponding to the first hole, a transistor positioned on the protection layer, the transistor including an active layer, a gate electrode, a source electrode, and a drain electrode, and a first insulating layer covering the transistor, the first insulating layer including a second hole exposing a portion of the source electrode or drain electrode, wherein a widest width of the first hole is greater than a width of the first opening.

In one embodiment, the first insulating layer may fill the first hole.

In one embodiment, the width of the first hole may be greater than the width of the first opening, and the protection layer may protrude in an overhang structure with respect to the first hole at the first opening.

The backplane may further include a pixel electrode positioned on the first insulating layer, the pixel electrode electrically connected to either the source electrode or the drain electrode via the second hole.

The backplane may further include a second insulating layer positioned on the first insulating layer covering an edge of the pixel electrode, the second insulating layer including a second opening exposing at least a portion of the pixel electrode.

The backplane may further include an intermediate layer positioned on the at least a portion of the pixel electrode exposed by the second opening, the intermediate layer including an organic emissive layer, and an opposite electrode positioned opposite the pixel electrode, with the intermediate layer therebetween.

The active layer may include amorphous silicon or polysilicon.

The backplane may further include a stopper covering a sidewall of the first hole and filling the first hole, and a passivation layer covering the transistor and the stopper, the passivation layer including a passivation hole exposing a portion of the source electrode or the drain electrode.

In one embodiment, the stopper may include an inorganic material capable of coating a surface of the first hole.

In one embodiment, the passivation layer may include silicon nitride ($Si_3N_4$).

The backplane may further include a protection film attached to a lower surface of the insulation substrate.

BRIEF DESCRIPTION OF THE DRAWINGS

The above and other features and advantages of embodiments of the present invention will become more apparent by the detailed description of exemplary embodiments, thereof, with reference to the attached drawings in which.

DETAILED DESCRIPTION

Figure 1:
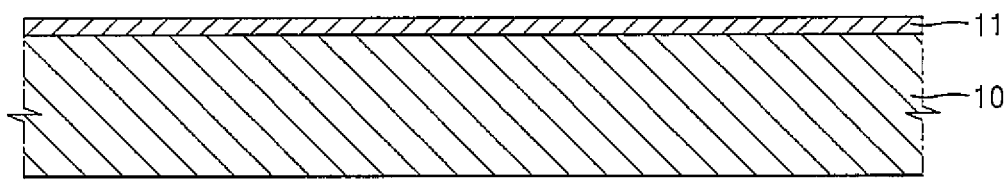
FIGS. 1 through 10 are schematic cross-sectional views illustrating a method of manufacturing a backplane of a flat panel display device, according to an embodiment of the present invention.

As the present invention allows for various changes and numerous embodiments, embodiments will be illustrated in the drawings and described in detail in the description. However, this is not intended to limit the present invention to a particular mode of practice, and it is to be appreciated that the present invention encompasses all changes, equivalents, and substitutes that do not depart from the spirit and technical scope thereof. In the description of the present invention, well-known methods will not be described in detail so as not to unnecessarily obscure the essence of the present invention.

While terms such as "first" and "second" may be used to describe various components, such components must not be limited to the above terms. The terms are used only to distinguish one component from another.

The terms used in the present application are merely used to describe an embodiment, and are not intended to limit the present invention. Use of singular forms includes plural references as well, unless expressly specified otherwise. The terms "comprising", "including", and "having" specify the presence of stated features, numbers, steps, operations, elements, components, and/or a combination thereof but do not preclude the presence or addition of one or more other features, numbers, steps, operations, elements, components, and/or combinations thereof.

When a part, such as a film, a layer, an area, a component, or the like is present "above" or "on" another part, the part may be located just on the other part, on another film, on another layer, on another area, on another component, or the like may be also interposed therebetween. As used herein, the term "and/or" includes any and all combinations of one or more of the associated listed items. Expressions such as "at least one of," when preceding a list of elements, modify the entire list of elements, and do not modify the individual elements of the list.

In embodiments of the present invention will now be described more fully with reference to the accompanying drawings, in which exemplary embodiments of the present invention are shown.

FIGS. 1 through 10 are schematic cross-sectional views illustrating a method of manufacturing a backplane of a flat panel display device, according to an embodiment of the present invention.

Referring to the embodiment shown in FIG. 1, a backplane includes a protection layer 11 formed on an insulation substrate 10. The insulation substrate 10 may be formed of a transparent material. For example, the insulation substrate 10 may be formed of a transparent plastic material, including acrylic resin, epoxy resin, phenolic resin, polyamide resin, polyimide resin, unsaturated polyester resin, polyphenylene resin, polyphenylene sulfide resin, benzocyclobutene (BCB), silicon oxide ($SiO_2$), silicon nitride ($Si_3N_4$), silicon oxynitride (SiOxNy), silicon oxycarbide (SiOxCy), silicon carbonitride (SiCxNy), aluminum oxide, titanium oxide, tantalum oxide, magnesium oxide, zinc oxide, hafnium oxide, zirconium oxide, or similar materials, or a combination thereof. However, the insulation substrate 10 is not limited thereto, and may be formed of a variety of materials, such as a transparent glass material including $SiO_2$ as a main component, a metal material, etc.

In some embodiments, the protection layer 11 prevents diffusion of impurity ions through an upper side of the insulation substrate 10, prevents penetration of moisture or air through the insulation substrate 10, and planarizes the surface of the insulation substrate 10. The protection layer 11 may include $SiO_2$, $Si_3N_4$, (SiOxNy), SiCxNy, SiOxCy, or similar materials, or a combination thereof. In these embodiments, the protection layer 11 may have a single or multi-layer structure formed of at least one silicon compound.

The insulation substrate 10 and the protection layer 11 may be formed by various methods, including, for example, spin coating, printing, sputtering, chemical vapor deposition, atomic layer deposition, plasma enhanced chemical vapor deposition, high density plasma-chemical vapor deposition, vacuum deposition, etc.

In one embodiment, the insulation substrate 10 may be formed on a glass substrate, and may be separated from the glass substrate by devices formed on the insulation substrate 10. However, a method of forming the insulation substrate 10 is not limited thereto.

Figure 2:
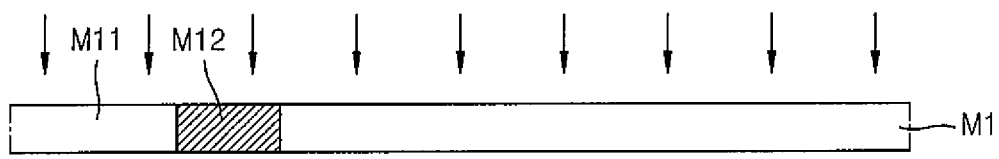

Referring to the embodiment shown in FIG. 2, a first photoresistor P1 is coated on the protection layer 11, and a first mask process is performed using a first mask M1 including a light transmission portion M11 and a light-blocking portion M12. In one embodiment, the first mask M1 may be a photomask, for example, and after exposing the first mask M1 using an exposure system, a series of subsequent processes may be performed, including developing, etching, and stripping or ashing.

Figure 3:
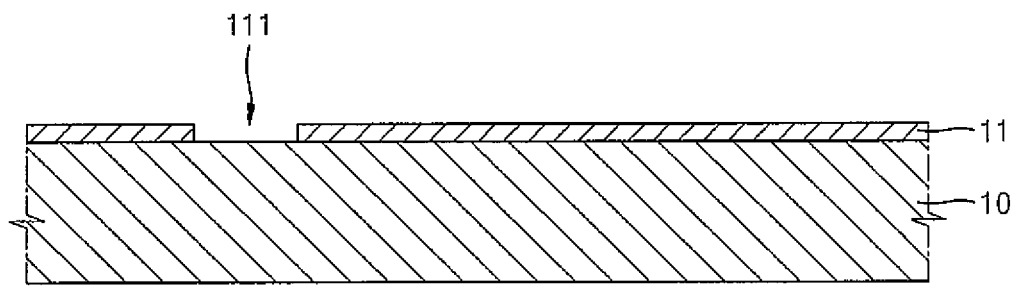

Referring to the embodiment shown in FIG. 3, a first opening 111 is formed in the protection layer 11 resulting from the first mask process. The first opening 111 may expose a portion of the insulation substrate 10.

Figure 4:
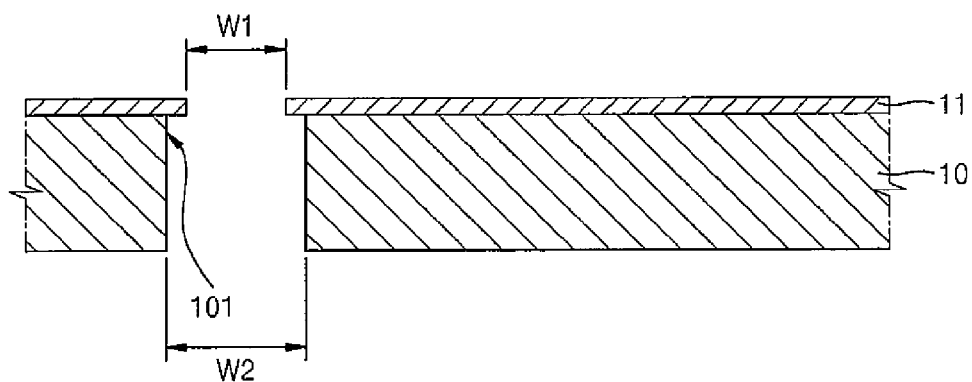

Referring to the embodiment shown in FIG. 4, a first hole 101 is formed in the insulation substrate 10 by removing a portion of the insulation substrate 10 exposed by the first opening 111. For example, the portion of the insulation substrate 10 exposed by the first opening 111 may be removed by an ashing process, forming the first hole 101.

In an embodiment where the insulation substrate 10 is sufficiently ashed, the first hole 101 is formed to be sufficiently large such that a width W2 of the first hole 101 may be wider than a width W1 of the first opening 111. For example, the first hole 101 is formed so that a distance from a center of the first opening 111 to a sidewall of the first hole 101 is greater than that from the center of the first opening 111 to a side end of the first opening 111.

In some embodiments, for example as shown in FIG. 4, the portion of the insulation substrate 10 that is removed includes a portion under the protection layer 11 and a portion corresponding to the first opening 111, forming an undercut structure. As illustrated in the embodiment shown in FIG. 4, the protection layer 11 protrudes in an overhang structure with respect to the first hole 101 in the area including the first opening 111.

In embodiments including an ashing process for forming the first hole 101, the protection layer 11 is not removed during the ashing process. In these embodiments, a material which is capable of partially removing the insulation substrate 10 without removing the protection layer 11 may be selected for use during the ashing process.

In embodiments including an ashing process, a gas such as an etching gas may be used for ashing. The etching gas may include dioxygen ($O_2$), carbon monoxide (CO), carbon dioxide ($CO_2$), or similar etching gases including an oxygen atom; nitrogen gas ($N_2$), ammonia ($NH_3$), or similar etching gases including a nitrogen atom; chloroiodide $ClI_2$, hydrogen chloride (HCl), boron trichloride ($BCl_3$), or similar etching gases including a chlorine atom; hydrogen bromide (HBr), bromine ($Br_2$), or similar etching gases including a bromine atom, or a mixed gas thereof. In other embodiments, a gas, such as argon (Ar), helium (He), or similar, may be added to an etching gas.

Gases generated from the insulation substrate 10 while performing subsequent processes may be discharged through the first hole 101. In these embodiments, the undercut structure of the first hole 101 prevents the first hole 101 from being plugged during a subsequent process or prevents an etched surface of the insulation substrate 10 inside the first hole 101 from being covered by another material.

Figure 5:
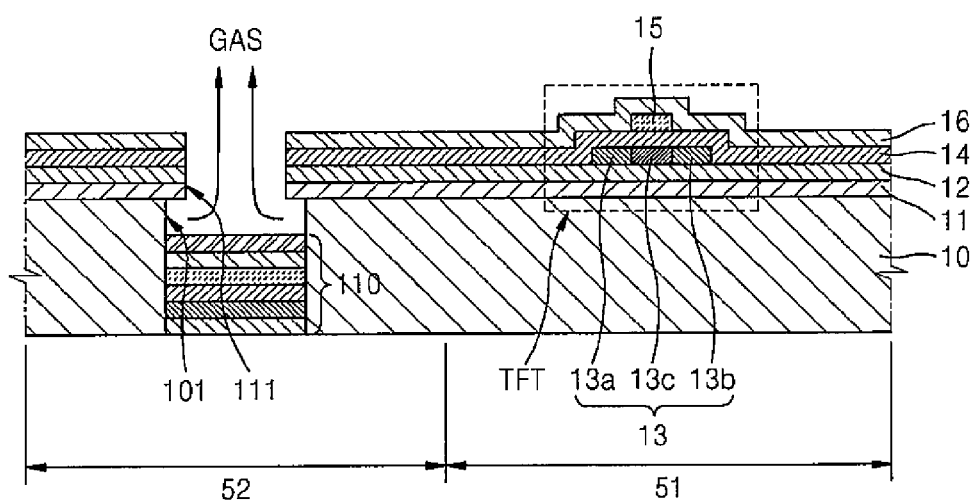

Referring to the embodiment shown in FIG. 5, a portion of a transistor, for example a thin-film transistor (TFT), is formed on the backplane structure shown in FIG. 4. The TFT includes an active layer 13, a gate electrode 15, a source region 13a, a drain region 13b, and at least one interlayer insulating film 16. The embodiment in FIG. 5 shows a structure in which the active layer 13, the gate electrode 15, and the interlayer insulating film 16 of the TFT are formed.

The TFT may be formed by various methods. For example, in one embodiment, the TFT may be formed by using a low-temperature polycrystalline silicon (LTPS) process.

Although a top gate-type TFT is illustrated in the embodiment shown in FIG. 5, the present invention is not limited thereto, and various types of TFTs may be formed. For example, in an embodiment where a bottom gate-type TFT is formed, the interlayer insulating film 16 may correspond to an insulating layer 12 interposed between the active layer 13 and source/drain regions 13a/13b.

In the embodiment shown in FIG. 5, an insulating layer 12 is formed on the protection layer 11, and a semiconductor layer is formed on a surface of the insulating layer 12. In this embodiment, the active layer 13 is then formed by patterning the semiconductor layer on the insulating layer 12. Next, an additional insulating layer 14 is formed covering the active layer 13, and a conductive layer formed on a surface of the additional insulating layer 14. In this embodiment, the gate electrode 15 is then formed by patterning the conductive layer on the additional insulating layer 14. Next, the interlayer insulating film 16 is formed covering the gate electrode 15.

The active layer 13 may include a material such as amorphous silicon or polysilicon. In an embodiment where the active layer 13 includes polysilicon, the polysilicon may be formed by crystallizing amorphous silicon.

In the embodiment shown in FIG. 5, ion impurities are doped or implanted onto the active layer 13 by using the gate electrode 15 as a self-aligning mask, and thus, a portion of the active layer 13 is doped with the ion impurities. As a result, the active layer 13 in this embodiment includes a source region 13a and a drain region 13b, which are doped with the ion impurities, and a channel area 13c located between the source region 13a and the drain region 13b in the same layer. Since the gate electrode 15 is used as the self-aligning mask in this embodiment, the source and drain regions 13a and 13b may be formed without an additional photomask.

Thus, in the embodiment shown in FIG. 5, the position of the gate electrode 15 and the position of the channel area 13c correspond to each other.

The ion impurity doping or implanting process described in the embodiment above requires a temperature over 400° C. The reliability of the insulation substrate 10 may be degraded at a temperature over 400° C. depending on the material of the insulation substrate 10. For example, if the insulation substrate 10 is formed of a transparent plastic material, an outgassing phenomenon in which a gas is emitted from the insulation substrate 10 at a temperature over 400° C. may occur. In this example, when the gas is not discharged properly, a structural defect such as a film rupture of the insulation substrate 10 may occur, thereby degrading the reliability of a display device utilizing the insulation substrate 10.

In the embodiment shown in FIG. 5, the first hole 101 formed in the insulation substrate 10 exposes the etched surface of the insulation substrate 10 to the outside, and allows for the discharge of gases generated from the insulation substrate 10 to the outside. Since the gases generated from the insulation substrate 10 are discharged through the first hole 101, generation of a structural defect such as a film rupture of the insulation substrate 10 is reduced. Although the embodiment in which only one first hole 101 is formed in the insulation substrate 10 is illustrated in FIG. 5 for convenience of explanation, the present invention is not limited thereto.

In the embodiment shown in FIG. 5, the insulation substrate 10 includes a transistor area 51 in which the TFT is formed, and a non-transistor area 52 in which the TFT is omitted. The first hole 101 may be formed in the non-transistor area 52 of the insulation substrate 10.

In the embodiment shown in FIG. 5, a portion of the insulation substrate 10 exposed by the first opening 111 is removed by an ashing gas to form the first hole 101. The protection layer 11 may include more openings. In the embodiment where the protection layer 11 includes more than one opening, since each opening exposes the insulation substrate 10 during the ashing process, additional holes may be formed in the insulation substrate 10. For example, the insulation substrate 10 may include one hole per one pixel to 100 pixels. When the insulation substrate 10 includes a large number of holes, gases generated in subsequent processes may be more sufficiently discharged.

Referring to the embodiment shown in FIG. 5, in the process of forming the TFT, at least some of the materials constituting the TFT are deposited in the first hole 101. For example, the same material as the insulating layer 12, the same material as the active layer 13, the same material as the additional insulating layer 14, the same material as the gate electrode 15, and the same material as the interlayer insulating film 16 may be sequentially deposited, forming a dummy pattern 110.

In the embodiment shown in FIG. 5, the dummy pattern 110 may be spaced from the etched surface of the insulation substrate 10 by the undercut structure of the first opening 111. For example, as shown in FIG. 5, the dummy pattern 110 may not cover the etched surface of the insulation substrate 10 in the first hole 101 at a location near the undercut structure of the first opening 111. Thus, since the etched surface of the insulation substrate 10 may still be exposed despite formation of the dummy pattern 110, allowing any gases generated from the insulation substrate 10 to still be discharged through the first hole 101. The height of the dummy pattern 110 may be shorter than that of the insulation substrate 10.

In the embodiment shown in FIG. 5, some of the layers constituting the dummy pattern 110 may be etched during a mask process of forming the TFT, and, thus, may be omitted from the dummy pattern 110. For example, layers corresponding to the active layer 13 and the gate electrode 15 of the TFT, from among the layers constituting the dummy pattern 110, may be etched when patterning the TFT. Since the insulating layer 12, the additional insulating layer 14, and the interlayer insulating film 16 (collectively hereinafter "the insulating layers") are not patterned by separate masks while forming the structure of FIG. 5, layers corresponding to the insulating layers 12, 14, and 16 may be formed in the first hole 101.

In some embodiments, if the number of additional mask processes is not limited, the dummy pattern 110 may not be formed in the first hole 101. For example, if the number of additional mask processes is not limited, layers corresponding to the insulating layers 12, 14, and 16 may be formed using an additional mask, and, thus, the insulating layers 12, 14, and 16 will not be formed in the first hole 101.

A stacked structure of the dummy pattern 110 is not limited to the structure illustrated in FIG. 5. For example, in other embodiments, some or all the layers of the dummy pattern 110 may be omitted. However, in the embodiments, the height of the dummy pattern 110 does not exceed the height of the insulation substrate 10.

Referring to the embodiment of FIG. 5, holes for exposing the source and drain regions 13a and 13b of the active layer 13 are formed by patterning the additional insulating layer 14 and the interlayer insulating film 16. In the embodiment shown in FIG. 6, a source electrode 17a and a drain electrode 17b are formed by patterning a conductive layer of the interlayer insulating film 16 after forming the conductive layer on a surface of the interlayer insulating film 16. In this embodiment, the source electrode 17a and the drain electrode 17b are connected to the source region 13a and the drain region 13b of the active layer 13 via holes formed in the additional insulating layer 14 and the interlayer insulating film 16, respectively.

Figure 6:
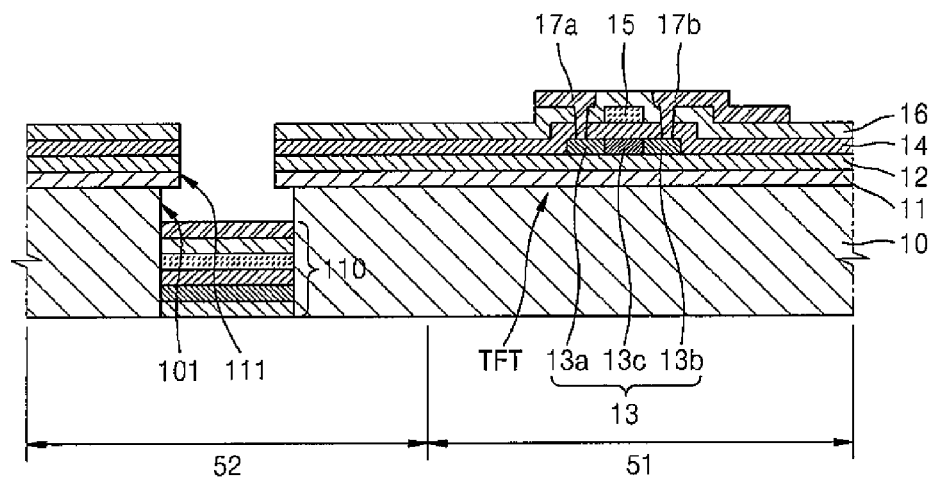
Figure 7:
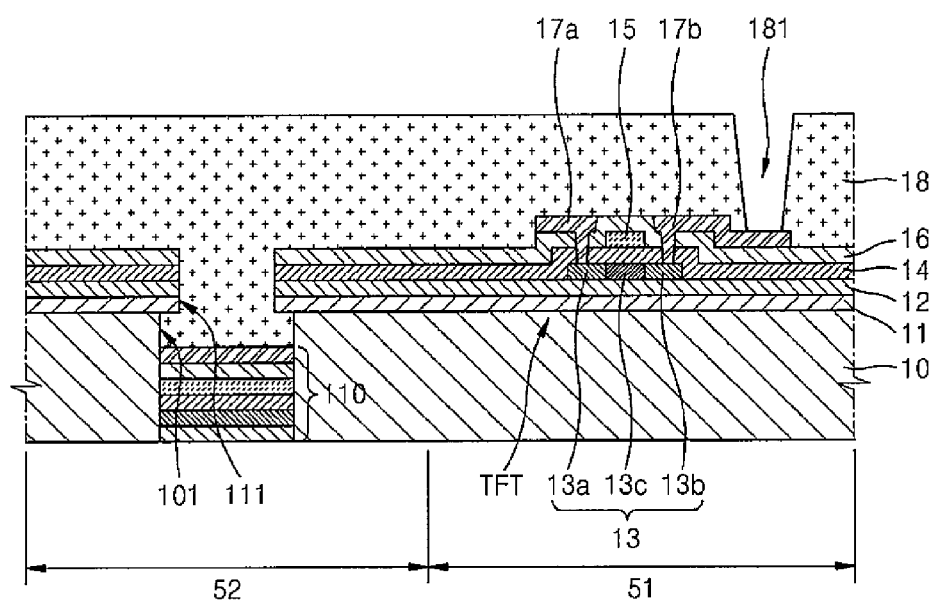

Referring to the embodiment shown in FIG. 7, a first insulating layer 18 is formed on the backplane structure shown in FIG. 6. The first insulating layer 18 covers the TFT, and includes a second hole 181 for exposing a portion of the source electrode 17a or the drain electrode 17b.

Figure 8:
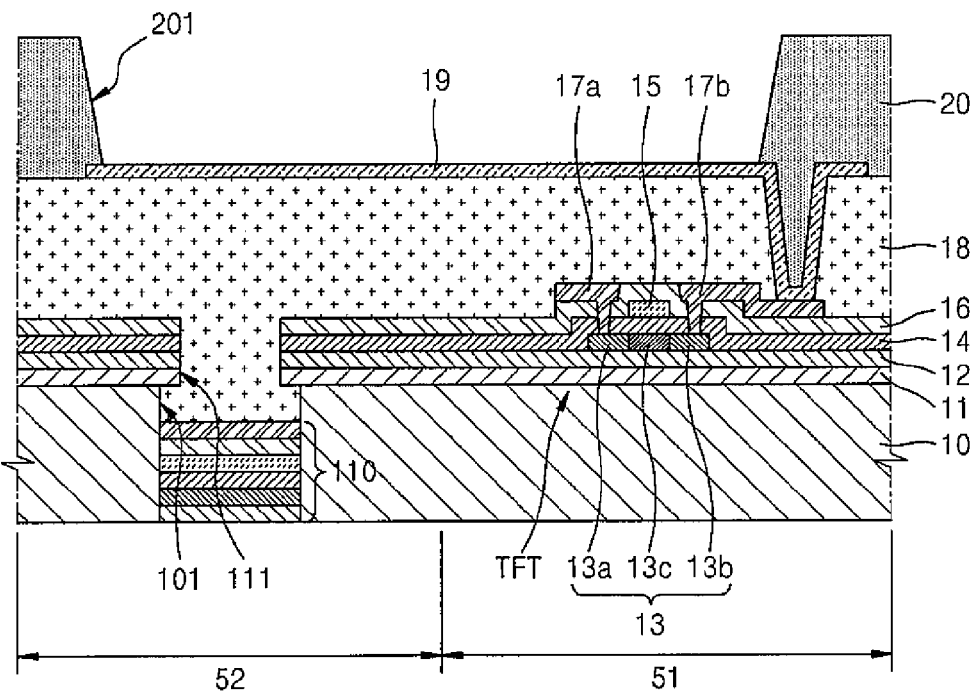

Referring to the embodiment shown in FIG. 8, a pixel electrode 19 is formed on the backplane structure shown in FIG. 7. The pixel electrode 19 in this embodiment is formed on the first insulating layer 18, and is connected to any one of the source electrode 17a and the drain electrode 17b via the second hole 181. Although in the embodiment shown in FIG. 8, the pixel electrode 19 is connected to the secondary drain electrode 17b, the present invention is not limited thereto.

The pixel electrode 19 may be formed of a transmission conductive layer, and may be formed of a plurality of layers which further include a semi-transmission layer located on the transmission conductive layer as well as the transmission conductive layer.

The pixel electrode 19 is not limited to the embodiment described above or shown in FIG. 8, and may have a multi-layer structure in which a transmission-type conductive layer, a reflection-type conductive layer, and a transmission-type conductive layer are sequentially stacked. The transmission-type conductive layer may include any material selected from among indium tin oxide (ITO), indium zinc oxide (IZO), zinc oxide (ZnO), and indium(III) oxide ($In_2O_3$), and the reflection-type conductive layer may include any material selected from among silver (Ag), an Ag alloy, aluminum (Al), and an Al alloy.

Referring to the embodiment shown in FIG. 8, a second insulating layer 20 is formed to cover an edge of the pixel electrode 19. In this embodiment, the second insulating layer 20 includes a second opening 201 for exposing at least a portion of the pixel electrode 19. The second insulating layer 20 may function as a pixel definition layer for defining an area of a light-emitting pixel.

Figure 9:
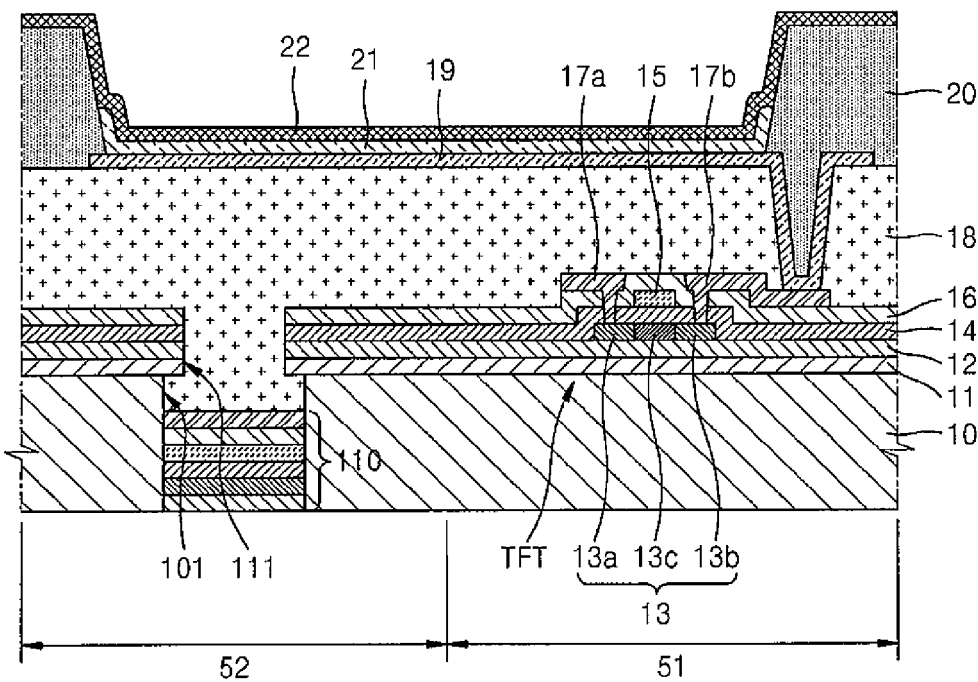

Referring to the embodiment shown in FIG. 9, an intermediate layer 21 and an opposite electrode 22 are formed on the backplane structure shown in FIG. 8. In this embodiment, the intermediate layer 21 is formed on the pixel electrode 19 exposed by the second opening 201 and includes an organic emissive layer. In this embodiment, the opposite electrode 22 is formed to be opposite to the pixel electrode 19, with the intermediate layer 21 located therebetween.

The intermediate layer 21 may be formed by stacking an organic emissive layer (EML) and a single or multi-layer structure, including one or more functional layers such as a hole transport layer (HTL), a hole injection layer (HIL), an electron transport layer (ETL), an electron injection layer (EIL), and the like. The intermediate layer 21 may be formed of a low-molecular weight organic material or a polymer organic material.

In the embodiment shown in FIG. 9, the intermediate layer 21 is formed in the second opening 201, and, thus, light-emissive materials are independently formed for respective pixels. However, the present invention is not limited thereto.

The intermediate layer 21 may be formed throughout the second insulating layer 20 regardless of locations of the pixels.

The opposite electrode 22 may be formed on the whole surface of a resultant structure resulting after forming the intermediate layer 21, and, thus, may function as a common electrode. In the flat panel display device according to the embodiment shown in FIG. 9, the pixel electrode 19 is used as an anode, whereas the opposite electrode 22 is used as a cathode, or vice versa.

If the flat panel display device according to the embodiment shown in FIG. 9 is a bottom-emission type, the opposite electrode 22 may be a reflective electrode including a reflective material. For example, the opposite electrode 22 may be formed by depositing a metal having a small work function, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), lithium fluoride/calcium (LiF/Ca), lithium fluoride/aluminum (LiF/Al), magnesium/silver (Mg/Ag), or a compound thereof, having a small thickness. In another embodiment where the flat panel display device is a top-emission type in which an image is formed in a direction opposite to the insulation substrate 10, the opposite electrode 22 is formed as a transparent electrode and the pixel electrode 19 is formed as a reflective electrode.

In one embodiment, an encapsulation member and an absorbent member that protect the intermediate layer 21 from external moisture, oxygen, or the like, may be further formed on the opposite electrode 22.

Figure 10:
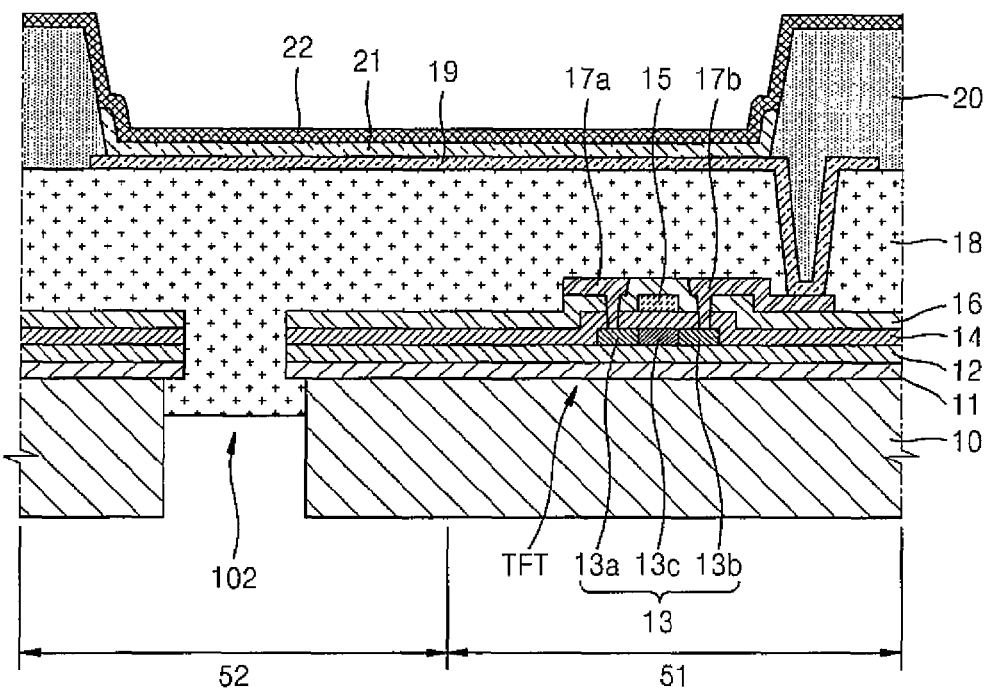

Referring to the embodiment shown in FIG. 10, the insulation substrate 10 of the backplane may be formed on a glass substrate, and may be separated from the glass substrate after devices are formed on the insulation substrate 10. In this embodiment, the dummy pattern 110 formed in the first hole 101 is separated and removed from the insulation substrate 10 together with the glass substrate. Since the dummy pattern 110 is removed from the insulation substrate 10, a groove 102 is formed in a lower portion of the insulation substrate 10, as shown in FIG. 10.

A protection film may be attached to a lower surface of the insulation substrate 10 preventing foreign substance penetration through the groove 102. The protection film may be attached to the lower surface of the insulation substrate 10 when the groove 102 is vacant, but the groove 102 may be filled with a material. For example, the groove 102 may be filled with an adhesive material before the protection film is attached to the lower surface of the insulation substrate 10.

Figure 11:
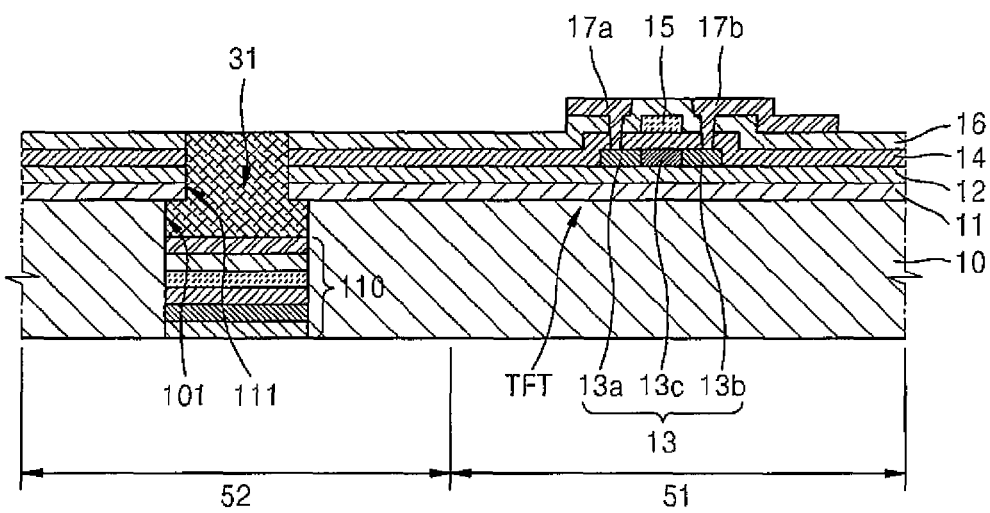
FIGS. 11 and 12 are schematic cross-sectional views illustrating a method of manufacturing a backplane of a flat panel display device, according to another embodiment of the present invention.
Figure 12:
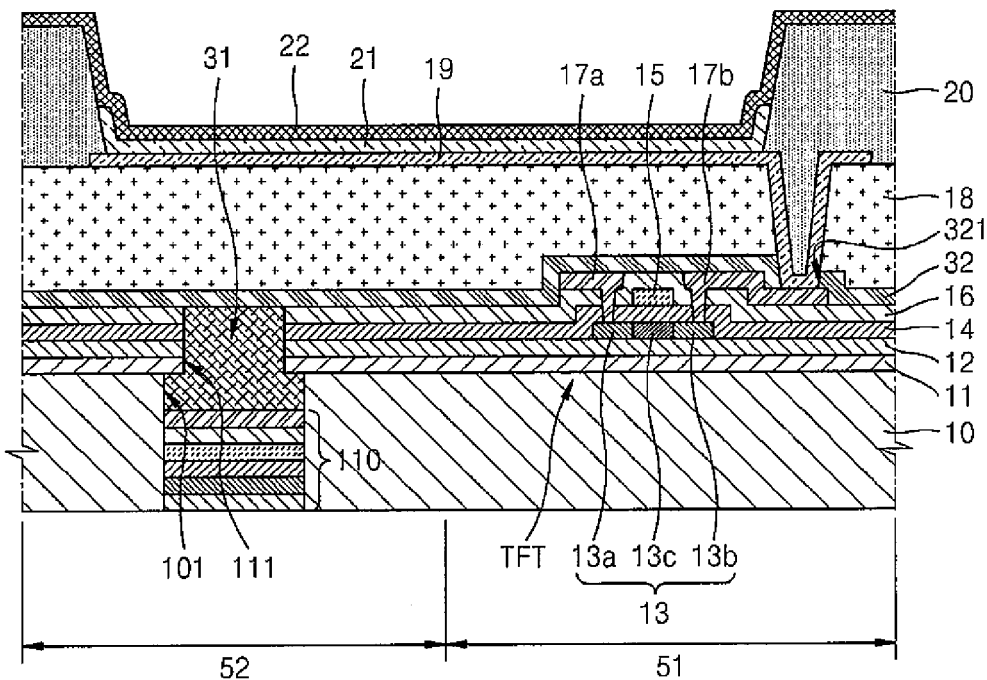

FIGS. 11 and 12 are schematic cross-sectional views illustrating a method of manufacturing a backplane of a flat panel display device, according to another embodiment of the present invention.

Referring to the embodiment shown in FIG. 11, a stopper 31 is formed on the structure shown in FIG. 6. In this embodiment, the stopper 31 is formed to fill an area under the protection layer 11 protruding from the first opening 111. The stopper 31 may be formed while filling the first hole 101. The stopper 31 may be formed of an inorganic material capable of coating a structure located under the stopper 31. For example, the stopper 31 may coat the sidewall of the first hole 101, as shown in FIG. 11. In this embodiment, the stopper 31 prevents generation of defects caused by the overhang structure of the first hole 101.

Referring to the embodiment shown in FIG. 12, a passivation layer 32 is formed on the structure shown in FIG. 11. In this embodiment, the passivation layer 32 is formed on the protection layer 11 or on the interlayer insulating film 16 of the TFT, covering both the TFT and the stopper 31. The passivation layer 32 in this embodiment includes a passivation hole 321 for exposing a portion of the secondary source electrode 17a or the secondary drain electrode 17b. The passivation layer 32 in this embodiment includes a material such as silicon nitride ($Si_3N_4$).

Processes explained with reference to FIGS. 7 through 10 may be identically performed on the structure resulting after forming the passivation layer 32 shown and described with reference to FIGS. 11 and 12. In the embodiment shown in FIG. 12, after forming the passivation layer 32, a first insulating layer 18, a pixel electrode 19, a second insulating layer 20, an intermediate layer 21, and an opposite electrode 22 are formed on the resulting structure. The passivation hole 321 of the passivation layer 32 may be formed while the first insulating layer 18 and the passivation layer 32 are simultaneously patterned. However, the present invention is not limited thereto.

Figure 13:
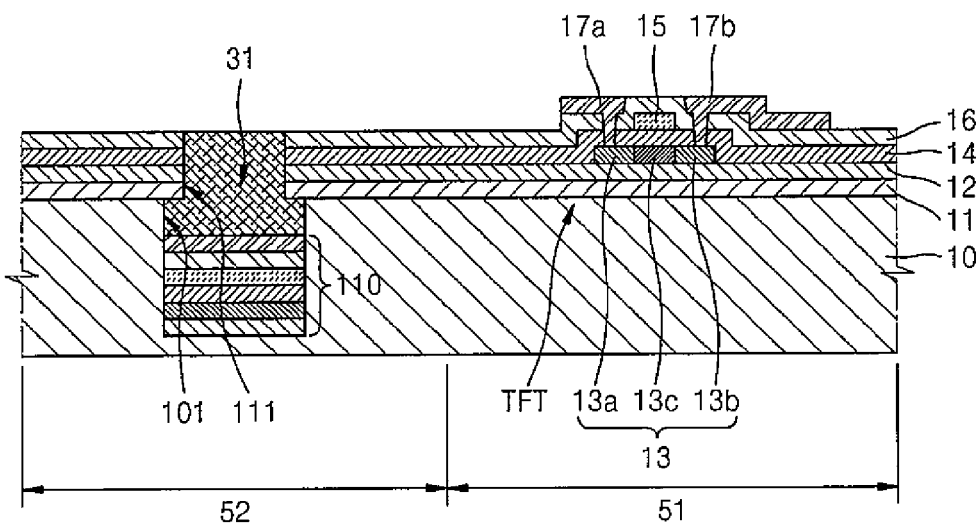
FIG. 13 is a schematic cross-sectional view illustrating a backplane of a flat panel display device, according to another embodiment of the present invention.

FIG. 13 is a schematic cross-sectional view illustrating a backplane of a flat panel display device, according to another embodiment of the present invention. In the embodiment of FIGS. 1 through 10 and the embodiment of FIGS. 11 and 12, the insulation substrate 10 exposed by the first opening 111 is removed up to the bottom thereof by using an ashing process to form the first hole 101. The first hole 101 in those embodiments is formed such that a glass substrate is exposed. However, in the embodiment shown in FIG. 13, a bottom portion of the insulation substrate 10 under the first hole 101 may not be fully removed, as illustrated in FIG. 13, according to the control of an ashing process time.

First and second insulating layers 18 and 20, a pixel electrode 19, an intermediate layer 21, and an opposite electrode 22 are formed on the structure shown in FIG. 13 in the same manner as the above-described embodiments. In addition, in the embodiment shown in FIG. 13, a passivation layer 32 for covering a TFT in which secondary source and drain electrodes 17a and 17b are formed may be formed before the formation of the first insulating layer 18.

According to the embodiment shown in FIG. 13, although the insulation substrate 10 may be separated from a glass substrate, a groove is not formed in a lower portion of the insulation substrate 10, thus preventing foreign substance or moisture penetration, and thereby improving the reliability of a display device using the insulation substrate 10 shown in the embodiment of FIG. 13. In addition, since the height of a dummy pattern 110 is shorter than that of the insulation substrate 10, and an etched surface of the insulation substrate 10 is exposed in the first hole 101, any gases emitted from the insulation substrate 10 during a subsequent manufacturing process may be discharged through the first hole 101.

According to the above-described embodiments of the present invention, the insulation substrate 10 includes a hole (or example, the first hole 101), and thus, any gases generated from the insulation substrate 10 during a subsequent manufacturing process is discharged to the outside through the hole, thereby preventing damage such as a film rupture of the insulation substrate 10 due to the gases.

According to the above-described embodiments, an undercut structure is formed in which the protection layer 11 formed above the first hole 101, partially protruding into an area of the first hole 101 area, resulting in continuous exposure at both sides of first hole 101 through the etched surface of the insulation substrate 10 during manufacturing processes. That is, although some substances are deposited in the first hole 101 during processes of manufacturing a backplane according to the present embodiments, any gases generated from the insulation substrate 10 may be discharged through the etched surface at both side of the first hole 101.

In the above-described embodiments, conductive patterns, such as the gate electrode 15, the source electrode 17a, and the drain electrode 17b, may include one or more materials selected from among the following materials: silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), molybdenum-tungsten (MoW), or copper (Cu). However, the present invention is not limited thereto, and the conductive patterns may be formed of any of conductive materials including, for example, metals.

In order to reduce wiring resistance, the conductive patterns in some embodiments may have a double-layer structure or multi-layer structure including Mo, Al, or Ag, which are lower resistance materials, i.e., a stack structure including a material selected from the group consisting of Mo/Al/Mo, MoW/Al—Nd/MoW, Ti/Al/Ti, Mo/Ag/Mo, Mo/Ag-alloy/Mo, and the like.

Although in the above-described embodiments, an organic light-emitting display (OLED) device is described as a flat panel display device, the present invention is not limited thereto and any of a variety of display devices such as a liquid crystal display (LCD) device and similar devices may be used as the flat panel display device.

Each of the above-described mask processes is not limited to a photomask process, and may use, for example, a lift-off method or any of a variety of patterning methods. The above-described etching process may be performed by any of a variety of etching methods such as, for example, wet etching, dry etching, and similar etching methods. In addition, although in the above-described embodiments, the photomask processes use a positive photoresist process by which a portion exposed to light is removed, the present invention is not limited thereto, and, for example, a negative photoresist process may also be used in the photomask processes.

Although a single transistor is illustrated in the above-described embodiments, this illustration is only for convenience of explanation, and the present invention is not limited thereto. As long as the number of mask processes used is not increased, a plurality of TFTs and a plurality of capacitors may be included in various embodiments.

While the present invention has been particularly shown and described with reference to exemplary embodiments thereof, it will be understood by those of ordinary skill in the art that various changes in form and detail may be made therein without departing from the spirit and scope of the present invention, as defined by the specification and the following claims.

What is claimed is:

1. A method of manufacturing a backplane for a flat panel display device, the method comprising:
   forming a protection layer on an insulation substrate, the protection layer comprising a first opening exposing a portion of the insulation substrate;
   forming a first hole in the insulation substrate by removing the portion of the insulation substrate exposed by the first opening, wherein a widest width of the first hole is greater than a width of the first opening; and
   forming a transistor on the protection layer, the transistor comprising an active layer, a gate electrode, a source electrode, and a drain electrode,
   forming a first insulating layer covering the transistor, wherein the first insulating layer fills at least a portion of the first hole,
   wherein the insulation substrate comprises a transistor area comprising the transistor, and a non-transistor area in which the first hole is formed and in which the transistor is omitted.

2. The method of claim 1, wherein a width of the first hole is wider than a width of the first opening.

3. The method of claim 1, wherein forming the first hole comprises removing the portion of the insulation substrate exposed by the first opening such that a distance from a center of the first opening to a sidewall of the first hole is greater than a distance from the center of the first opening to a side end of the first opening.

4. The method of claim 1, wherein the protection layer protrudes in an overhang structure with respect to the first hole at the first opening.

5. The method of claim 1, wherein forming the transistor further comprises depositing at least some materials comprising the transistor into the first hole, forming a dummy pattern.

6. The method of claim 5, wherein a height of the dummy pattern is shorter than a height of the insulation substrate.

7. The method of claim 5, wherein the first insulating layer comprises a second hole exposing a portion of the source electrode or drain electrode.

8. The method of claim 7, further comprising forming a pixel electrode on the first insulating layer, the pixel electrode being electrically connected to either of the source electrode or the drain electrode via the second hole.

9. The method of claim 8, further comprising forming a second insulating layer on the first insulating layer covering an edge of the pixel electrode, the second insulating layer comprising a second opening exposing at least a portion of the pixel electrode.

10. The method of claim 9, further comprising:
    forming an intermediate layer comprising an organic emissive layer on the at least a portion of the pixel electrode exposed by the second opening; and
    forming an opposite electrode on the pixel electrode with the intermediate layer therebetween.

11. The method of claim 1, wherein forming the first hole comprises removing the portion of the insulation substrate exposed by the first opening using an ashing process.

12. The method of claim 1, wherein the active layer comprises amorphous silicon or polysilicon, and forming the transistor further comprises using a low-temperature polycrystalline silicon (LTPS) process.

13. A backplane for a flat panel display device, the backplane comprising:
    an insulation substrate comprising a transistor area comprising a transistor, and a non-transistor area including a first hole;
    a protection layer positioned on the insulation substrate, the protection layer comprising a first opening corresponding to the first hole;
    a transistor positioned on the protection layer, the transistor comprising an active layer, a gate electrode, a source electrode, and a drain electrode; and
    a first insulating layer covering the transistor, the first insulating layer comprising a second hole exposing a portion of the source electrode or drain electrode,
    wherein the first insulating layer fills at least a portion of the first hole,
    wherein a widest width of the first hole is greater than a width of the first opening.

14. The backplane of claim 13, a width of the first hole is greater than the width of the first opening, and the protection layer protrudes in an overhang structure with respect to the first hole at the first opening.

15. The backplane of claim 13, further comprising a pixel electrode positioned on the first insulating layer, the pixel electrode electrically connected to either the source electrode or the drain electrode via the second hole.

16. The backplane of claim 15, further comprising a second insulating layer positioned on the first insulating layer covering an edge of the pixel electrode, the second insulating layer comprising a second opening exposing at least a portion of the pixel electrode.

17. The backplane of claim 16, further comprising:
   an intermediate layer positioned on the at least a portion of the pixel electrode exposed by the second opening, the intermediate layer comprising an organic emissive layer; and
   an opposite electrode positioned opposite the pixel electrode, with the intermediate layer therebetween.

18. The backplane of claim 13, wherein the active layer comprises amorphous silicon or polysilicon.

\* \* \* \* \*